US010468489B2

(12) United States Patent
Lilak et al.

(10) Patent No.: US 10,468,489 B2
(45) Date of Patent: Nov. 5, 2019

(54) ISOLATION STRUCTURES FOR AN INTEGRATED CIRCUIT ELEMENT AND METHOD OF MAKING SAME

(71) Applicant: Intel Corporation, Santa Clara, CA (US)

(72) Inventors: Aaron D. Lilak, Beaverton, OR (US); Uygar E. Avci, Portland, OR (US); David L. Kencke, Beaverton, OR (US); Patrick Morrow, Portland, OR (US); Kerryann Foley, Portland, OR (US); Stephen M. Cea, Hillsboro, OR (US); Rishabh Mehandru, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/747,719

(22) PCT Filed: Sep. 25, 2015

(86) PCT No.: PCT/US2015/052324
§ 371 (c)(1),
(2) Date: Jan. 25, 2018

(87) PCT Pub. No.: WO2017/052616
PCT Pub. Date: Mar. 30, 2017

(65) Prior Publication Data
US 2018/0226478 A1    Aug. 9, 2018

(51) Int. Cl.
*H01L 29/417*    (2006.01)
*H01L 21/84*    (2006.01)
(Continued)

(52) U.S. Cl.
CPC ...... *H01L 29/41791* (2013.01); *H01L 21/845* (2013.01); *H01L 27/1211* (2013.01); *H01L 29/785* (2013.01)

(58) Field of Classification Search
CPC ............ H01L 29/41791; H01L 21/845; H01L 27/1211; H01L 29/785; H01L 27/14643; H01L 27/14689; H01L 27/14612
See application file for complete search history.

(56) References Cited

U.S. PATENT DOCUMENTS

| 5,955,781 A | 9/1999 | Joshi et al. |
| 2003/0194839 A1 * | 10/2003 | Chung ............. H01L 29/66772 438/151 |

(Continued)

FOREIGN PATENT DOCUMENTS

KR    10-0677048    2/2007

OTHER PUBLICATIONS

International Search Report and Written Opinion for International Patent Application No. PCT/US2015/052324 dated Jul. 11, 2016, 14 pgs.

(Continued)

*Primary Examiner* — Changhyun Yi
(74) *Attorney, Agent, or Firm* — Schwabe, Williamson & Wyatt, P.C.

(57) ABSTRACT

Techniques and mechanisms to provide insulation for a component of an integrated circuit device. In an embodiment, structures of a circuit component are formed in or on a first side of a semiconductor substrate, the structures including a first doped region, a second doped region and a third region between the first doped region and the second doped region. The substrate has formed therein an insulation structure, proximate to the circuit component structures, which is laterally constrained to extend only partially from a location under the circuit component toward an edge of the substrate. In another embodiment, a second side of the substrate—opposite the first side—is exposed by thinning to form the substrate from a wafer. Such thinning enables subsequent back side processing to form a recess in the (Continued)

second side, and to deposit the insulation structure in the recess.

21 Claims, 12 Drawing Sheets

(51) Int. Cl.
*H01L 27/12* (2006.01)
*H01L 29/78* (2006.01)

(56) References Cited

U.S. PATENT DOCUMENTS

| | | | |
|---|---|---|---|
| 2004/0150013 A1 | 8/2004 | Ipposhi | |
| 2006/0118880 A1* | 6/2006 | Komoda | H01L 21/823807 257/369 |
| 2006/0292770 A1* | 12/2006 | Wu | H01L 21/84 438/187 |
| 2007/0012970 A1* | 1/2007 | Mouli | H01L 27/14603 257/292 |
| 2008/0286918 A1* | 11/2008 | Shaviv | H01L 21/823412 438/211 |
| 2010/0140617 A1 | 6/2010 | Kuroda | |
| 2014/0367777 A1 | 12/2014 | Huang et al. | |

OTHER PUBLICATIONS

International Preliminary Search Report for International Patent Application No. PCT/US2015/052324, dated Apr. 5, 2018, 10 pages.

* cited by examiner

US 10,468,489 B2

ISOLATION STRUCTURES FOR AN INTEGRATED CIRCUIT ELEMENT AND METHOD OF MAKING SAME

CROSS-REFERENCE TO RELATED APPLICATION

This patent application is a U.S. National Phase Application under 35 U.S.C. § 371 of International Application No. PCT/US2015/052324, filed Sep. 25, 2015, entitled "ISOLATION STRUCTURES FOR AN INTEGRATED CIRCUIT ELEMENT AND METHOD OF MAKING SAME," which designates the United States of America, the entire disclosure of which is hereby incorporated by reference in its entirety and for all purposes.

BACKGROUND

1. Technical Field

Embodiments discussed herein relate generally to the field of semiconductor circuits and more specifically, but not exclusively, to structures for providing isolation of an integrated circuit component.

2. Background Art

Transistors and other integrated circuit components are typically connected together to form larger circuits, such as very large scale integrated circuits, ultra-large scale integrated circuits, memory, and other types of circuits. When the size of circuit components, for example, is reduced and integration increases, problems related to undesirable charge leakage—or, alternatively, undesirable charge accumulation—tend to arise. Electrical insulation mitigates charge transfer to and/or from such circuit components.

Semiconductor on insulator (SOI) wafers are used to provide such electrical insulation. However, SOI wafers are an additional source of bill of material expense, and often have a high rate of defects, as it is difficult to produce thin, uniform semiconductor layers in fabrication. Defect problems in SOI structures include defects within a single wafer (e.g., the thickness of a wafer differs at various points on the wafer) and defects from wafer to wafer (e.g., an inconsistent mean silicon layer thickness among SOI wafers). As successive generations of integrated circuit fabrication technology continue to scale down in size, there is increasing value placed on insulation of integrated circuit components.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1:
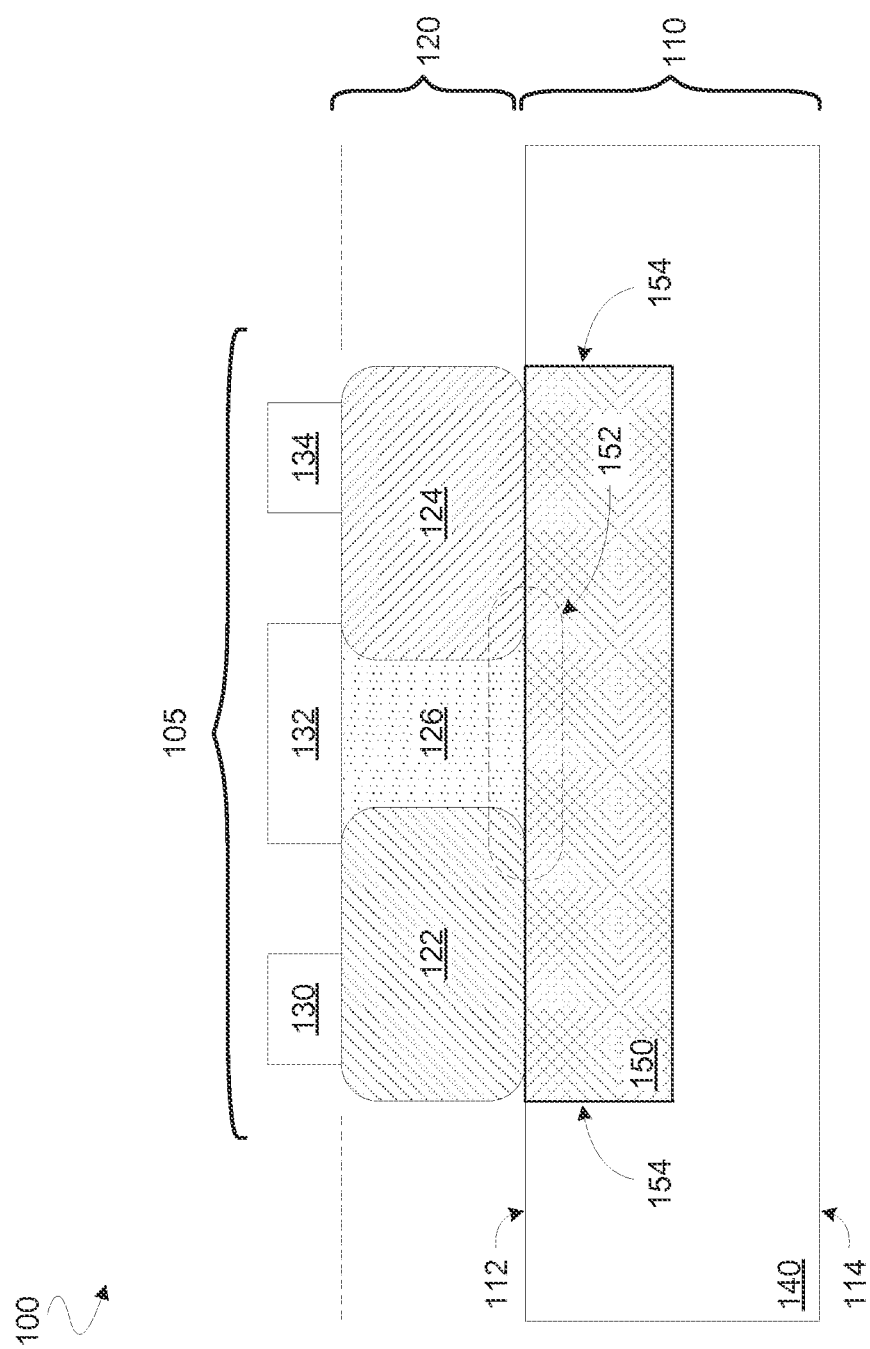
FIG. 1 is a cross-sectional view of a semiconductor device including insulation structures according to an embodiment.

Embodiments discussed herein variously include techniques and/or mechanisms to provide insulation for a circuit component of an integrated circuit device. In some embodiments, integrated circuitry includes a circuit component, such as a transistor or a gated diode, structures of which are formed in or on a first side of a semiconductor substrate. The integrated circuitry may further comprise an insulation structure to control an accumulation of charge with the circuit component. The insulation structure may be disposed at least in part below the first side—e.g., where a dielectric or other insulation material is formed via processing on a back side (opposite the first side) of the semiconductor substrate.

As used herein with respect to a substrate of an integrated circuit device, "front side" (unless otherwise indicated) refers to a side of the substrate on which structures of a circuit component are disposed and/or in which structures of the circuit component extend. Such structures may include a doped region of the substrate—e.g., where the circuit component is a transistor, and a doped region is to serve as a source of the transistor or a drain of the transistor. Alternatively or in addition, such structures may include a gate that is disposed directly or indirectly on the front side of the substrate. Operation of the circuit component may include activation of a channel that is to exchange current in a depletion region that adjoins the front side. As used herein with respect to a substrate, "back side" refers to a side of the substrate is opposite to the front side of that substrate—e.g., where the front side and back side extend in respective planes that are parallel to, and offset from, one another. A structure may be considered to be "above" a front side of a substrate where the structure is in direct contact with the front side or, alternatively, is coupled to the substrate via another structure on the front side. Similarly, a structure may be considered to be "below" (or "under") a back side of a substrate where the structure is in contact with back side or, alternatively, is coupled to the substrate via another structure on the back side.

Some embodiments variously provide an insulator structure formed in a substrate (e.g., that of an IC chip), where the substrate has formed therein or thereon a circuit component. Such an insulator may have, for example, a dielectric constant of 3.8 or more and, in some embodiments, 7.3 or more. As used herein with reference to an insulator structure, "laterally constrained" refers to a characteristic of the insulator structure having a limited maximum extent in one or more directions each in parallel with a front side (and similarly, to a back side) of the substrate in which the insulator structure is disposed. An insulation structure may be laterally constrained, for example, at least insofar as at least part of the insulation structure extends, for example, only partially toward an edge of the substrate. Accordingly, a maximum extent of the insulation structure in a given direction away from the circuit component may be less than an extent, in that same direction, of an edge of the substrate from the circuit component. For example, the insulation structure may be limited from extending below one or more other circuit components that are also disposed in or on the substrate.

Certain features of various embodiments are described herein with reference to a circuit element including fin structures that are variously formed on a front side of a semiconductor substrate. However, such description may be extended to additionally or alternatively apply to any of a variety of other circuit element architectures—e.g., where a circuit element of an IC device according to an embodiment instead has one or more structures doped into the front side of such a substrate. The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices including integrated circuitry.

FIG. 1 shows elements of an integrated circuit (IC) device 100 including structures to control charge accumulation according to an embodiment. Circuit component 105 is just one example of a non-linear circuit element including structures variously formed in or on a first (front) side of a semiconductor substrate, where an insulator disposed in the substrate is configured to enable (or in some embodiments, to prevent) an accumulation of charge in or under such structures.

In the illustrative embodiment shown, circuit component 105 includes structures 120 variously disposed in or on a front side 112 of a substrate 110. Substrate 110 may comprise a semiconductor material 140 including, for example, doped silicon and/or any of various other suitable substrate materials used in conventional wafer processing. Formation of structures 120 may include, for example, operations adapted from any of a variety of conventional complementary metal-oxide-semiconductor (CMOS) and/or other fabrication processing techniques, which are not detailed herein to avoid obscuring certain features of various embodiments. Structures 120 may include doped regions 122, 124 that, for example, are to serve, respectively, as a transistor source and a transistor drain. In another embodiment, doped regions 122, 124 are to function as terminal structures of a gated diode element. Circuit component 105 may further comprise a gate structure 132 formed over a region 126 between doped regions 122, 124. Operation of the circuit component 105 may be responsive at least in part to signals variously received via one or more of gate structure 132 and terminal contacts 130, 134 coupled to doped regions 122, 124, respectively. Such one or more signals may facilitate activation of a channel to exchange charge in region 126—e.g., where region 126 includes a depletion region.

The IC device 100 may further comprise an insulation structure 150 that, for example, aids in the accumulation of charge in or under region 126. Alternatively, insulation structure 150 may aid in preventing or otherwise limiting an accumulation of such charge. Insulation structure 150 may extend to form an interface 152 with region 126—e.g., where interface 152 extends to doped region 122 and/or to doped region 124. In some embodiments, insulation structure 150 extends from interface 152 to a back side 114 of substrate 110—e.g., where a surface of semiconductor material 140 and a surface of insulation structure 150 form respective areas of back side 114. Alternatively, conductive structures (not shown)—referred to herein as "back side metal"—may be disposed between insulation structure 150 and back side 114. Such back side metal (e.g., comprising copper, aluminum and/or the like) may provide an interconnect path—e.g., where insulation structure 150 limits charge dissipation from the circuit component to the back side metal. Alternatively, a back side metal may provide a discharge path—e.g., to dissipate charge rather than allow for accumulation of such charge at or near the circuit component.

The extent of insulation structure 150 in substrate 110 in a direction parallel to side 112 (or to side 114) may be limited by one or more sides 154 formed by insulation structure 150 and adjoining materials of substrate 110. The one or more sides 154 may limit insulation structure 150 to an area that excludes any or all edges of substrate 110—e.g. where insulation structure 150 is prevented from extending under another circuit component (not shown) that is also formed in or on side 112.

Figure 2:
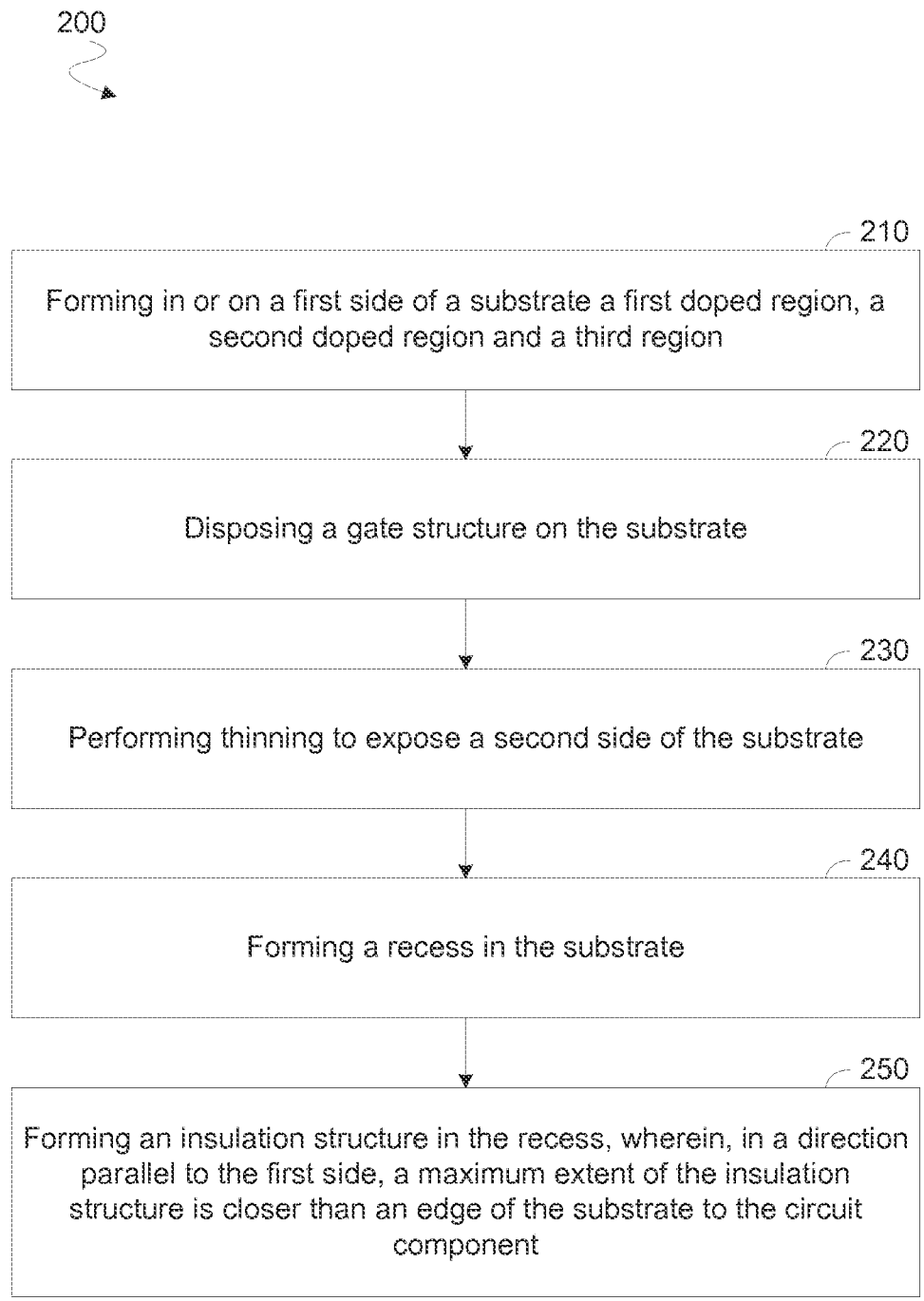
FIG. 2 is a flow diagram illustrating elements of a method to fabricate a semiconductor device according to an embodiment.

FIG. 2 illustrates elements of a method 200 for providing insulation structures of an integrated circuit device according to an embodiment. Method 200 may fabricate structures of IC device 100, for example. Method 200 is one example of an embodiment that utilizes a back side reveal process to enable deposition of an insulation material through a back side of a substrate. Such processing may allow for the selective formation of one or more insulation structures—e.g., each under a respective one or more circuit components—that are laterally constrained, where "laterally" in this context refers to an extent of an insulation structure in a direction that is parallel to a substrate front side (or back side). Such selective formation may eliminate the need for a silicon-on-insulator (SOI) wafer in the fabrication of integrated circuit structures such as those described herein. These integrated circuit structures may be fabricated on a single-crystal/bulk substrate wafer and allow for some circuit elements of an IC die to be disposed over a bulk substrate, where other circuit elements of the same IC die are disposed over laterally constrained bodies of insulation material such as any of various insulators provided by conventional SOI wafer.

Method 200 may include operations to fabricate a circuit component—e.g., a non-linear circuit element such as a transistor or a diode. Although some embodiments are not limited in this regard, the circuit component may include fin structures disposed on a substrate. In an embodiment, method 200 comprises, at 210, forming in or on a first (front) side of a substrate a first doped region, a second doped region and a third region between the first doped region and the second doped region. The first doped region, second doped region and third region may correspond functionally doped regions 122, 124 and region 126, for example. The substrate may include any of a variety of silicon and/or other semiconductor materials that are used in conventional wafer fabrication processes. In some embodiments, the substrate further comprises an epitaxial layer formed on the substrate material, where the epitaxial layer forms the first (e.g., front) side of the substrate. The particular materials, thickness, crystal structures, doping etc. of the substrate may be adapted from conventional wafer processing techniques, which are not detailed herein and are not limiting on various embodiments. The forming at 210 may include performing doping through the first side to form in the substrate one or more transistor source regions and/or transistor drain regions. For example, the first doped region and second doped region may include n+ doped source and drain regions of a transistor. However, circuit component according to different embodiments may include any of a variety of other doping schemes—e.g., adapted from conventional integrated circuit designs.

Method 200 may further comprise, at 220, disposing a gate structure on the substrate—e.g., wherein the gate structure is coupled to the substrate via the first side. The disposing at 220 may include patterned deposition processing on the first side to form an insulating layer (e.g., an oxide) and a metal, polysilicon or other conductive material of the gate structure. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. This high-k material may additionally be thermally annealed. In an embodiment, the forming at 210 and/or the disposing at 220 includes operations adapted from any of a variety of mask, etch, doping, metal deposition (e.g., plating) and/or other processes for fabricating transistor structures according to existing techniques.

Method 200 may include, at 230, performing thinning to expose a second side of the substrate, the second side opposite the first side. For example, method 200 may form the substrate from a wafer that includes the first side. After a circuit component is formed in the wafer by processing at 210 and 220, a handling wafer may be coupled to the wafer via the first side. The handling wafer may provide mechanical support during thinning of the wafer material to form the substrate. The thinning at 230 may include grinding, wet etching, chemical mechanical polishing (CMP) and/or other such processes to remove bulk semiconductor material of the wafer. In an embodiment, the thinning at 230 results in an overall thickness between the first side and the exposed second side which allows for etching, deposition and/or other processing to form insulation structures that, for example, are coupled to one or all of the regions formed at 210.

For example, Method 200 may further comprise forming a recess in the substrate, at 240, after the thinning at 230. The recess may be formed via patterned etching or other removal processing at the exposed second side of the substrate. In an embodiment, the recess extends though the second side (e.g., through a plane in which a portion of the second side extends) and at least partially through the substrate to a level that is at or proximate to a side of the third region. The recess may further extend to be at or proximate to a side of the first doped region and/or a side of the second doped region. Formation of the recess at 240 may include plasma and/or other etch processing operations such as one or more adapted from conventional IC fabrication techniques. In an embodiment, a patterned mask limits the formation of the recess to an area that is less than that of a portion of the substrate being processed by method 200. For example, a cross-sectional area of the recess within the substrate or at the second side of the substrate may be less than that of an eventually-formed IC chip that is to include the recess. Accordingly, the recess (and an insulation structure eventually formed with the recess) may be laterally constrained— e.g., wherein the recess is surrounded by other structure of the substrate that is also to be included in the same IC chip. Of a plurality of circuit components to be included in such an IC chip, the recess may extend under (and in some embodiments, adjoin) only a subset of such circuit components. In some embodiments, the forming at 240 includes forming in the second side multiple laterally constrained recesses, where each of the multiple recesses extends below a different respective one or more circuit components.

In an embodiment, method 200 further comprises, at 250, forming in the recess an insulation structure that is laterally constrained—e.g., wherein, in a direction parallel to the first plane, a maximum extent of the insulation structure is closer than an edge of the substrate to the circuit component. Formation of the insulation structure at 250 may include deposition of an oxide of silicon or other insulator material. The insulator material may comprise silicon dioxide, an oxynitride, a nitride any of a variety of other suitable insulators. Formation of the insulation structure at 250 may include, for example, deposition of the insulator material via chemical vapor deposition (CVD), atomic-layer deposition (ALD), molecular beam epitaxy (MBE), or any of a variety of other means that, for example, are adapted from conventional deposition techniques. In some embodiments, an insulator may be formed via thermal oxidation or thermal nitridation or thermal reaction of a deposited material. By way of illustration and not limitation, a deposition of a polysilicon may be followed by an anneal in oxygen to consume deposited polysilicon, resulting in a new silicon dioxide region. In another embodiment, sputter deposition of magnesium (Mg) followed by an oxidizing anneal may form a magnesium oxide insulation structure. In some embodiment, the insulation structure formed at 250 includes a high-k insulator material such as hafnium, silicon, oxygen, titanium, tantalum, lanthanum, aluminum, zirconium, barium, strontium, yttrium, lead, scandium, niobium, and zinc. This high-k material may additionally be thermally annealed.

Figure 3A:
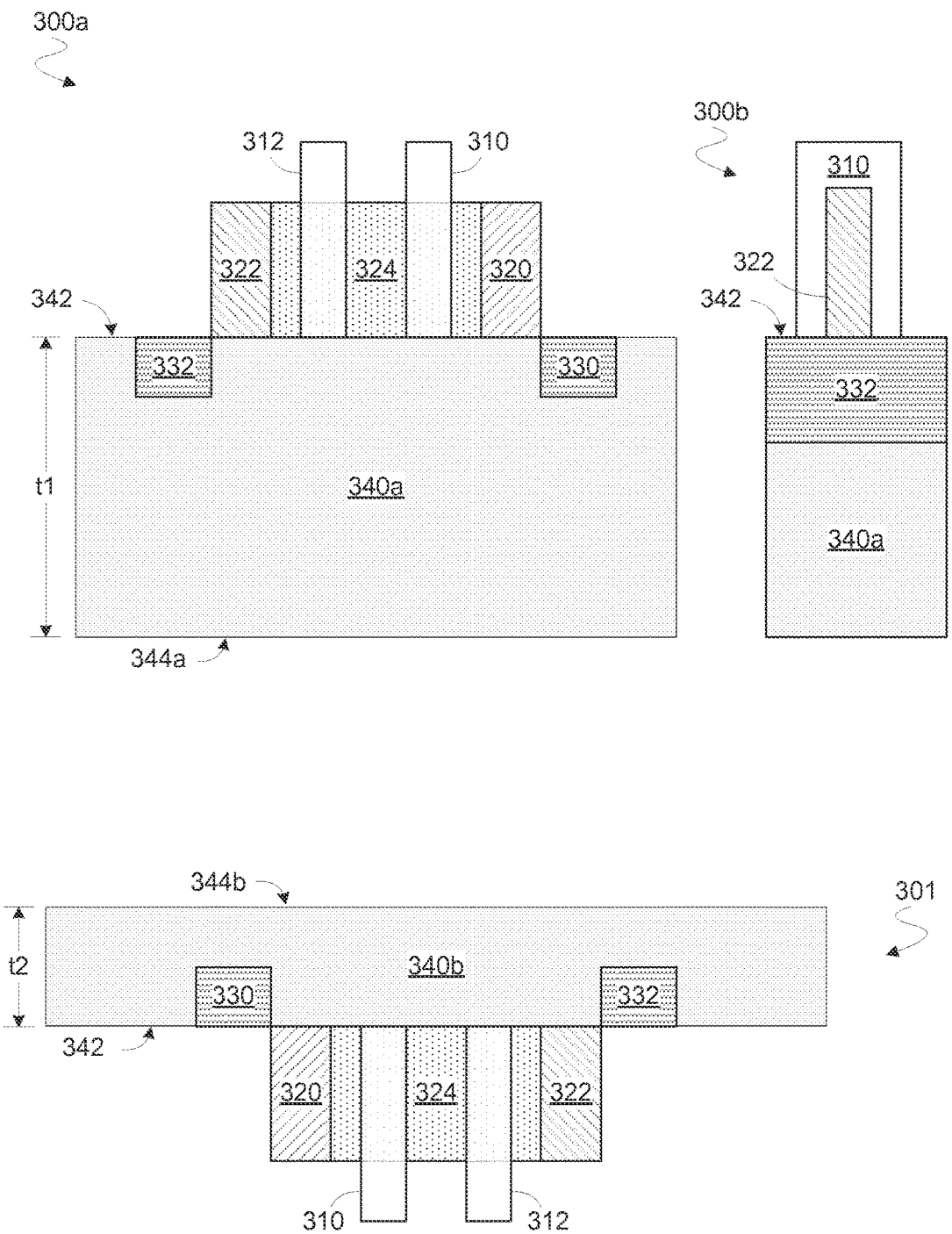
FIGS. 3A, 3B show cross-sectional views illustrating processing to fabricate a semiconductor device according to an embodiment.
Figure 3B:
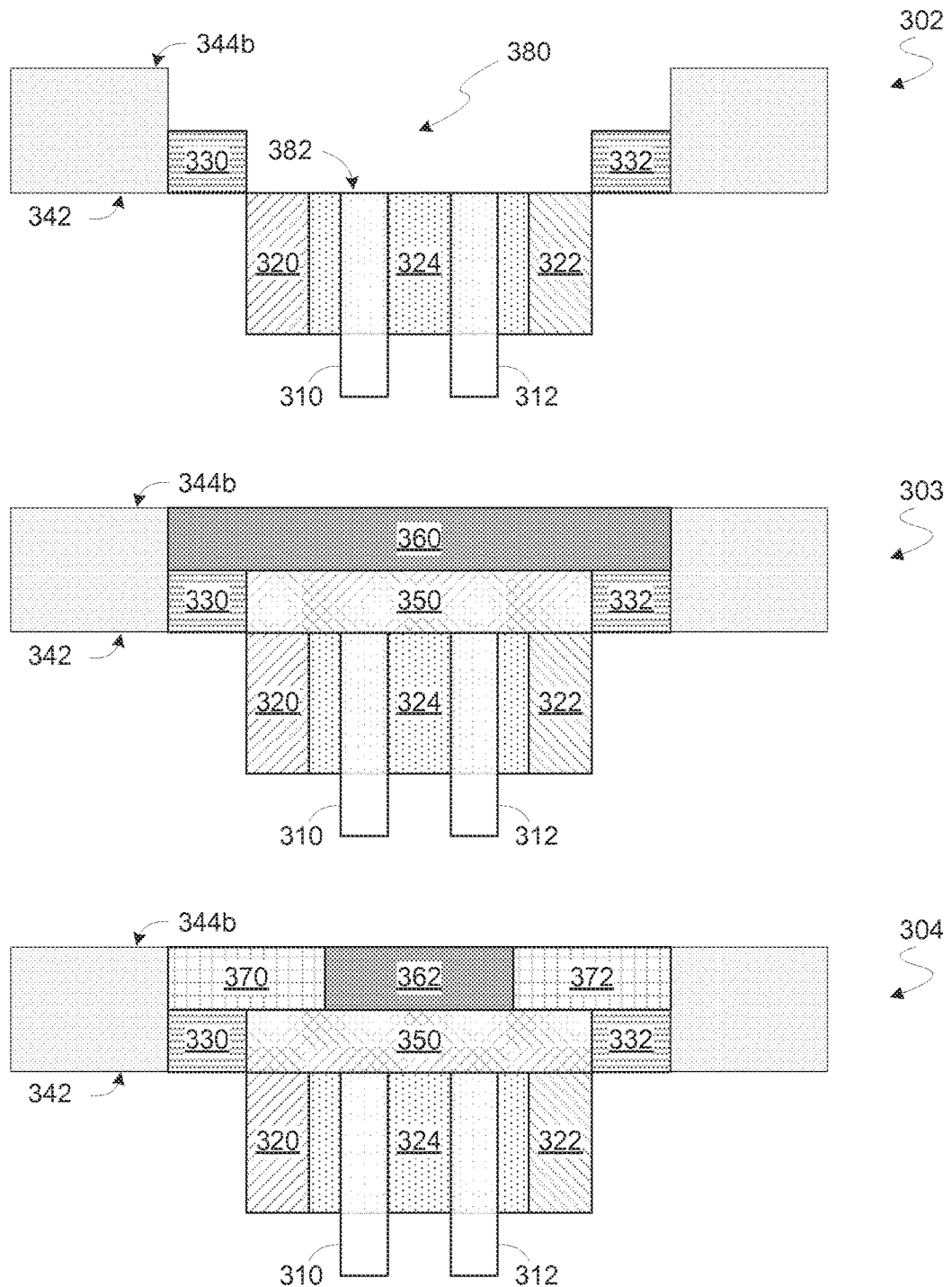

FIGS. 3A, 3B show various cross-sectional views of integrated circuitry during respective stages of processing to fabricate insulation structures according to an embodiment. The processing represented in FIGS. 3A, 3B may include some or all operations of method 200, for example. In an embodiment, structures formed by such processing may aid in controlling charge accumulation by circuitry such as that of IC device 100.

Views 300a, 300b illustrate different respective cross-sections of structures during a processing stage when elements of a circuit component are variously disposed in or on a front side 342 of a wafer 340a. Later processing operations may form from wafer 340a a substrate 340b including semiconductor material of wafer 340a. In the illustrative embodiment shown, the circuit component includes fin structures formed on front side 342—e.g., where the circuit component is a fin field effect transistor (FET), or "FinFET." For example, side 342 may have formed thereon a p+ doped structure 320, an n+ doped structure 322—e.g., to operate as a source and a drain, respectively—and a channel fin 324 of the circuit component. Gate structures of the circuit component (including, for example, one or both of the illustrative gates 310, 312) may be formed on one or both sides of channel fin 324. The particular doping of structures shown in FIGS. 3A, 3B is merely illustrative, and any of a variety of other combinations of structure doping may be provided, according to different embodiments. Gates 310, 312 may variously receive signaling to control activation of a channel in channel fin 324—e.g., the channel to exchange current between doped structures 320, 322.

Although some embodiments are not limited in this regards, processing may also form in or on front side 342 one or more structures—e.g. including the illustrative trench structures 330, 332—to aid in at least partial isolation of the circuit component from other circuitry (not shown) of the IC device. For example, trench structures 330, 332 may have disposed therein silicon oxide, silicon nitride, silicon oxynitride and/or any of a variety of other suitable dielectric materials. Alternatively or in addition, structures formed in or on front side 342 may aid in limiting a lateral extent of an insulation structure that is to be formed by later back side processing.

In one illustrative embodiment, the circuit component is a gated diode—e.g., where channel fin 324 is p– doped. Insulation structures formed under such a gated diode may, according to an embodiment, prevent or otherwise mitigate a charge spike at the circuit component—e.g., where an electrostatic discharge event might otherwise send charge from the substrate into the gated diode. In some embodiments, the circuit component is a floating body double gated diode that is coupled to operate, for example, as a DRAM memory cell. Such a memory cell may rely upon floating body capacitance characteristics of the circuit component for storing charge that is to be representative of a data value. In such an embodiment, insulation structures formed under the memory cell may aid in the accumulation of charge at or below the circuit component, thus aiding in data storage with the memory cell.

Processing after the stage represented in views 300a, 300b may include inverting or otherwise orienting and positioning wafer 340a in preparation for thinning that is to remove some of the substrate material of wafer 340a. For example, a handling wafer (not shown) may be coupled to wafer 340a via front side 342, where the handling layer is to provide mechanical support during thinning of wafer 340a. Such thinning may remove semiconductor material of wafer 340a that forms a side 344a, resulting in the formation of a substrate 340b from wafer 340a. In one illustrative embodiment, wafer 340a, which has a thickness t1 that, for example, is on the order of several hundred micrometers—e.g., in a range of 200-500 micrometers (um)—or, in the case of a membrane type substrate, in a range of 30-100 um. The thickness t1 may be reduced to a thickness t2 that, for example, is on the order of 1-10 um or, in the case of a membrane type substrate, may be in a range of 50-250 nanometers (nm). As shown in view 301, such thinning may expose a back side 344b of substrate 340b that is opposite front side 342.

The thickness t2 resulting from thinning to form substrate 340b may allow for subsequent etching and/or other processing—on or through back side 344b—to form in substrate 340b a recess structure that extends to (or near) one or more structures of the circuit component formed in or on side 342. For example, as represented in view 302, mask and etch processing may be performed to form a recess 380 that extends from side 344b. Such a recess 380 may extend at least partially through the substrate—e.g., where a bottom 382 of recess 380 is at, or proximate to, one or more of doped regions 320, 322 and channel fin 324. In some embodiments, the recess 380 also extends to expose one or both of trench structures 330, 332, at least in part.

Mask, etch, deposition and/or other processing may subsequently be performed in or through side 344b to form one or more structures within recess 380. By way of illustration and not limitation, a dielectric 350 (as shown in view 303) may be disposed on at least part of the bottom 382 of recess 380. The dielectric 350 may adjoin, and by laterally constrained by, other structure of substrate 340b, such as the illustrative trench structures 330, 332. Although some embodiments are not limited in this regard, one or more other structures—e.g., including back side metal, gap fill material (e.g., silicon dioxide, $SiO_2$) and/or the like—may also be disposed in recess 380 over dielectric 350. View 303 illustrates one embodiment wherein a back-side metal 360 (e.g., copper) is formed on dielectric 350, where back-side metal 360 is also in direct contact with a semiconductor material of substrate 340b. View 304 illustrates an alternate embodiment to that of view 303, wherein a back-side metal 363 is only indirectly coupled via gap fill structures 370, 372 to semiconductor material of substrate 340b.

Figure 4:
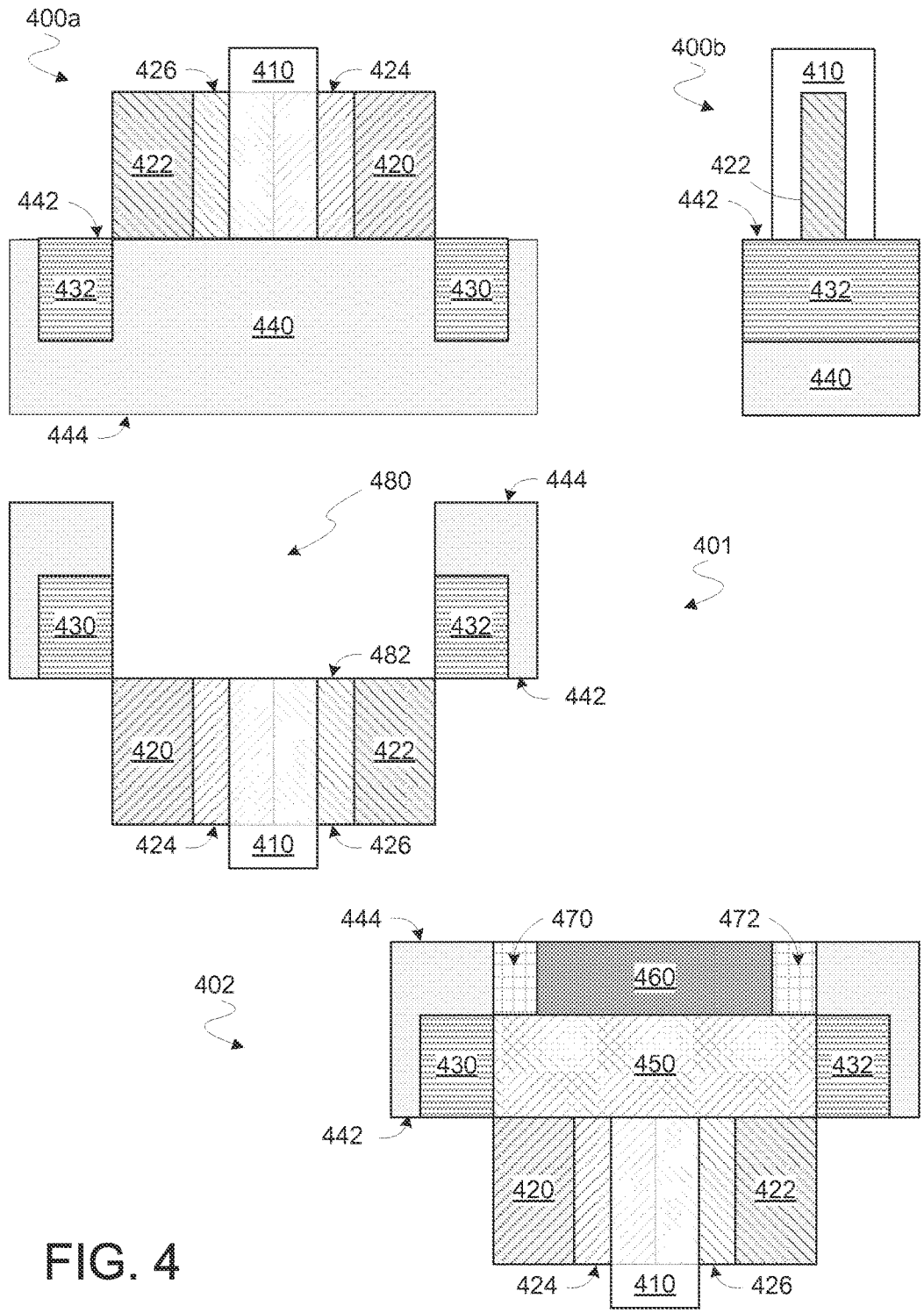
FIG. 4 shows cross-sectional views illustrating processing to fabricate a semiconductor device according to an embodiment.

FIG. 4 show various cross-sectional views of integrated circuitry during fabrication processing according to another embodiment. The processing represented in FIG. 4 may include one or more features of the processing represented by FIGS. 3A, 3B and/or may include some or all operations of method 200.

Views 400a, 400b illustrate different respective cross-sections for a processing stage during which elements of a circuit component—e.g., a gated diode—are variously disposed in or on a front side 442 of a substrate 440. A back side 444 of substrate 440, opposite front side 442, may have been formed by thinning of a wafer, the thinning performed after formation of the circuit component in and/or on the wafer. Such thinning may allow for later processing in and/or through side 444 to form an insulation structure under the circuit component. In the illustrative embodiment shown, the circuit component includes a p+ doped structure 420, an n+ doped structure 422 and a fin structure between doped structures 420, 422, the fin structure including a p– doped structure 424 and an n– doped structure 426. Gate structures of the circuit component may be formed on one or more sides of the fin structure—e.g., where a gate 410 extends at least partially around one or both of p– doped structure 424 and n– doped structure 426. The particular doping of structures shown in FIGS. 4A, 4B is merely illustrative, and may include any of a variety of other doping schemes, according to different embodiments. Gate 410 may aid in the activation of a channel to exchange current in one or both of p– doped structure 424 and n– doped structure 426. In addition to the circuit component shown in views 400a, 400b, the integrated circuitry may include trench structures 430, 432 or other such structures to aid in isolating the circuit component at least in part from other circuitry (not shown).

After the processing stage represented in views 400a, 400b, mask, etch and/or other processing may be performed to form a recess 480, shown in view 401, that extends from side 444. Such a recess 480 may extend at least partially through the substrate 440—e.g., where a bottom 482 of recess 480 is at, or proximate to, one or more of doped regions 420, 422, 424, 426. In some embodiments, the recess 480 also extends to one or both of trench structures 430, 432. Mask, etch, deposition and/or other processing may subsequently be performed in or through side 444 to form one or more structures within recess 480. By way of illustration and not limitation, a dielectric 450 (as shown in view 402) may be disposed on a least part of the bottom 482 of recess 480. The dielectric 450 may adjoin, and be laterally constrained by, other structure of substrate 440 such as one or both of trench structures 430, 432. In one embodiment, a back-side metal 460 is formed on dielectric 450—e.g., between gap fill structures 470, 472 that are also deposited on or through side 444.

Figure 5A:
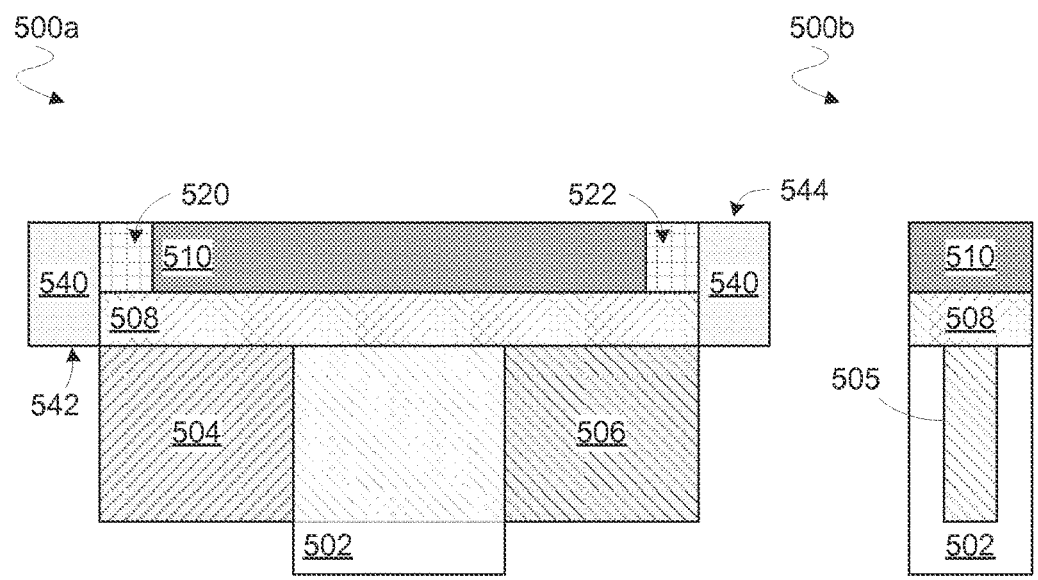
FIGS. 5A, 5B show cross-sectional views of respective semiconductor devices each including insulation structures according to a corresponding embodiment.

FIG. 5A shows cross-sectional views 500a, 500b of integrated circuitry including insulation structures to aid operation of a gated diode according to an embodiment. The integrated circuitry represented in FIG. 5A may include insulation structures such as those of IC device 100, for example. In an embodiment, processing to fabricate such insulation structures includes some or all operations of method 200. The gated diode shown in views 500a, 500b includes structures variously formed in or on a front side 542 of a substrate 540—e.g., where such structures include a p+ doped structure 504, an n+ doped structure 506 and an n– doped fin 505 disposed between doped structures 504, 506. Activation of a channel in n– doped fin 505 may be based at least in part on a signal received via a gate 502 of the gated diode—e.g., where gate 502 extends over and around opposing sides of n– doped fin 505.

Substrate 540 may have formed therein an insulation structure 508 comprising a dielectric that extends across (e.g., adjoins) n– doped fin 505 and, in some embodiments, one or both of doped structures 504, 506. Insulation structure 508 may be formed, for example, by processing in or on a back side 544 of substrate 540. An extent of insulation structure 508 in a direction parallel to side 542 (or parallel to side 544) may be limited by structure of substrate 540 that defines one or more lateral sides of insulation structure 508. In the illustrative embodiment shown, semiconductor material of substrate 540 defines at least part of a perimeter of insulation structure 508 at side 542. Such a perimeter may limit of insulation structure 508 from further extending under one or more other transistors, diodes and/or other circuit components (not shown) formed in or on side 542. A back-side metal 510 and gap fill structures 520, 522 may also be formed in between side 544 and insulation structure 508, although certain embodiments are not limited in this regard.

Figure 5B:
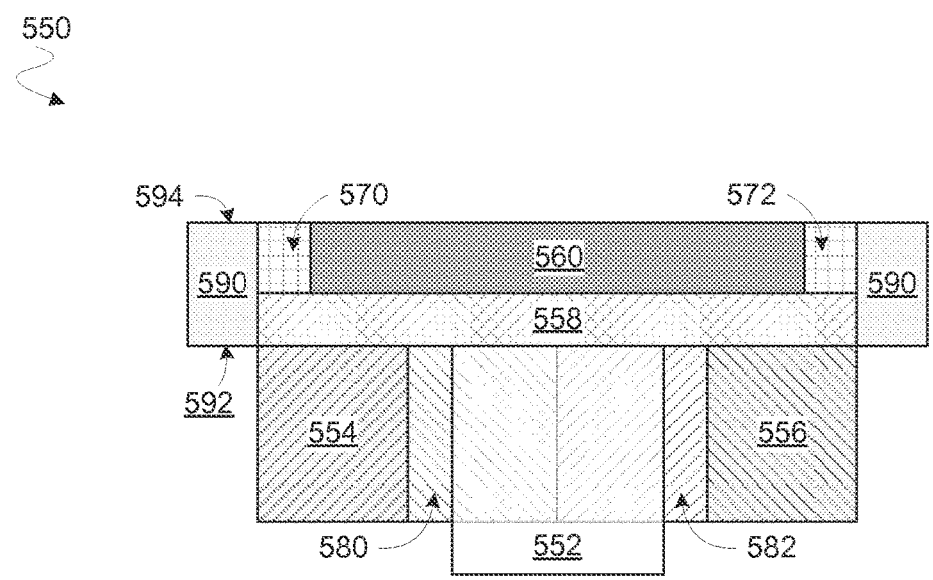

FIG. 5B shows a cross-sectional view 550 of integrated circuitry including insulation structures to aid operation of a gated diode according to an embodiment. The integrated circuitry represented in FIG. 5B may include one or more features of the device represented in FIG. 5A, for example. The gated diode shown in view 550 includes structures variously formed in or on a front side 592 of a substrate 590. For example, such structures may include a p+ doped structure 554, an n+ doped structure 556, an n– doped structure 580 and a p– doped structure 582 (where structures 580, 582 are each disposed between structures 554, 556). A gate 552 of the gate diode may extend around opposing sides of both structure 580 and structure 582, where gate 552 is to aid in selective activation of a channel within structures 580, 582 to exchange charge between structures 554, 556. An insulation structure 558 may be formed under the gated diode—e.g. by processing in or on a back side 594 of substrate 590. The extent of insulation structure 558 may be constrained at least in part by structure of substrate 590 that defines one or more lateral sides of insulation structure 558. In the illustrative embodiment shown, a back-side metal 560 and gap fill structures 570, 572 are also formed in between side 594 and insulation structure 558.

Figure 6A:
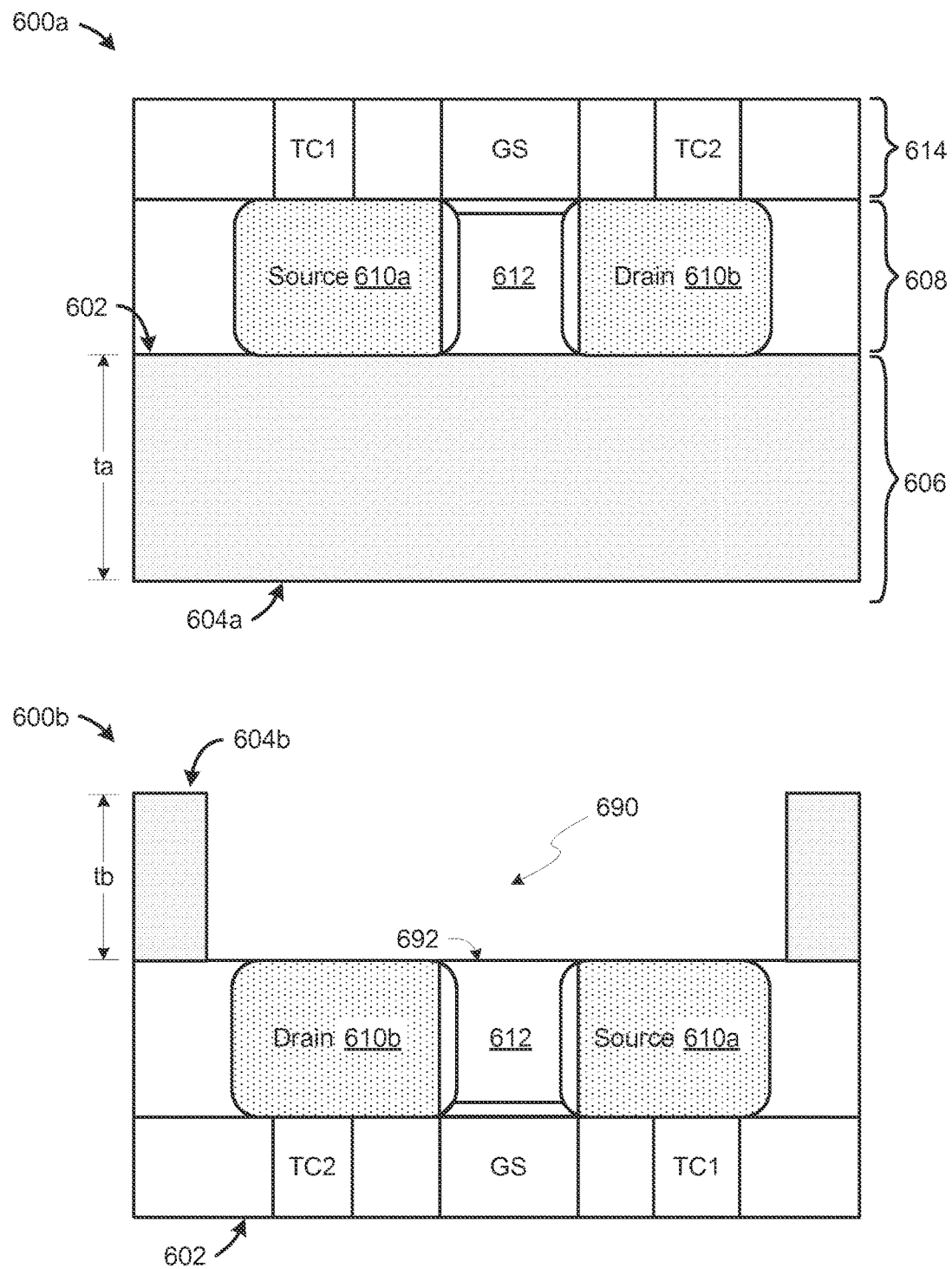
FIGS. 6A-6C show cross-sectional views illustrating processing to fabricate a semiconductor device according to an embodiment.
Figure 6B:
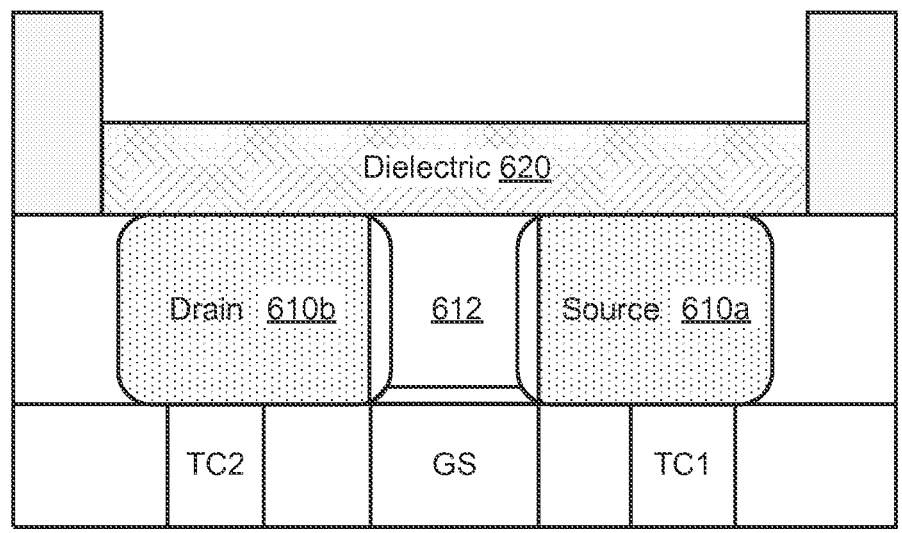
Figure 6B:
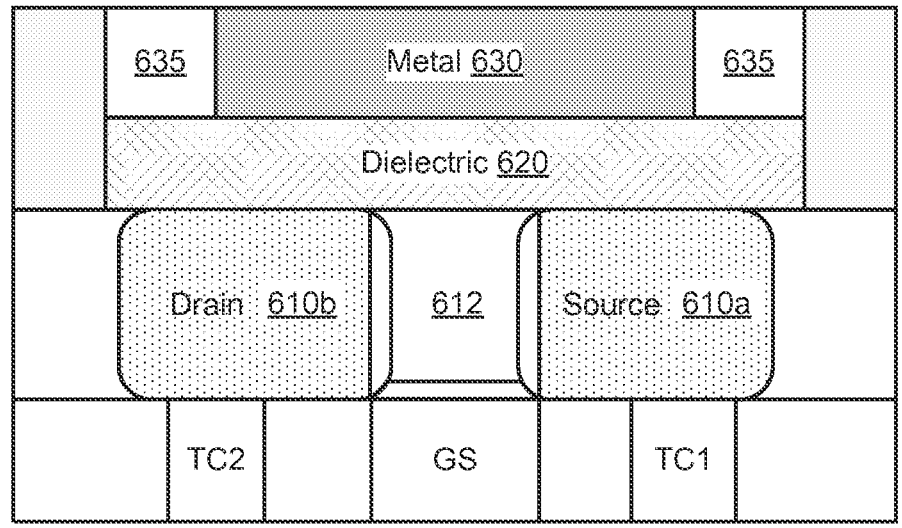

FIGS. 6A, 6B show various cross-sectional views of structure during respective stages of processing to fabricate insulation structures to aid operation of a circuit component according to an embodiment. The processing represented in FIGS. 6A, 6B may include some or all operations of method 200, for example. In an embodiment, such processing is to provide an insulation structure such as that of IC device 100 or other integrated circuitry described herein.

At represented in stage 600a, structures 608 of a transistor (or in another embodiment, a gated diode) may be variously disposed in or on a front side 602 of a wafer 606, where a substrate is to be subsequently formed wafer 606. In the illustrative embodiment, the transistor is a FinFET—e.g., where structures 608 thereof include a doped source region 610a, a doped drain region 610b and a depletion region 612 (between doped regions 610a, 610b) that all extend above surface 602. A gate structure GS may extend both over depletion region 612 and along opposing sidewalls of depletion region 612. For example, at least part of gate structure GS may extend in a metal layer 614 above structures 608—along with source and drain terminal contacts TC1, TC2 of the transistor—as well as along sidewalls of depletion region 612. Any of a variety of doping schemes may be provided by the substrate and components of the transistor, according to different embodiments.

Processing after stage 600a may include inverting or otherwise orienting and positioning wafer 606, structures 608 and metal layer 614 for thinning that is to remove some of the substrate material of wafer 606. For example, a handling wafer (not shown) may be coupled to wafer 606 via front side 602 (e.g., indirectly via structures 608 and metal layer 614), where the handling layer is to provide mechanical support during thinning of wafer 606. Such thinning may result in the formation of a substrate from wafer 606. In one illustrative embodiment, wafer 606, which has a thickness to in a range of 30-500 um, is reduced to a thickness tb that (for example) is in a range of 50-500 nm. As shown at stage 600b, such thinning may expose a back side 604b of the substrate that is opposite front side 602.

The thickness t2 resulting from thinning to form the substrate may allow for subsequent processing—on or through back side 604b—to form in the substrate recess structures extending at least partially through the substrate and proximate to structures 608. As illustrated in stage 600b, mask and etch processing may be performed to form a 690 recess that extends from side 604b, where a bottom 692 of recess 690 adjoins some or all of doped regions 610a, 610b and depletion region 612. Selective deposition processing may form in recess 690 a dielectric 620 (e.g., an oxide), shown at stage 600c, that is to provide at least some insulation of the circuit component. The dielectric 620 may serve as an insulator that is constrained laterally by an isolation trench and/or other structures that define sidewalls of dielectric 620. In an embodiment, a fill metal 630 and/or gap fill structures 635 are further formed by deposition processing via back side 604b.

Figure 6C:
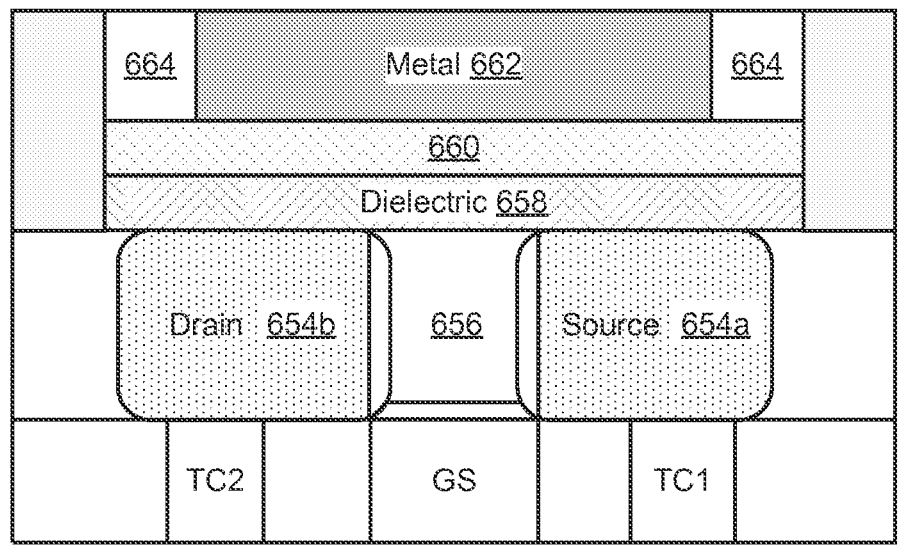
Figure 6C:
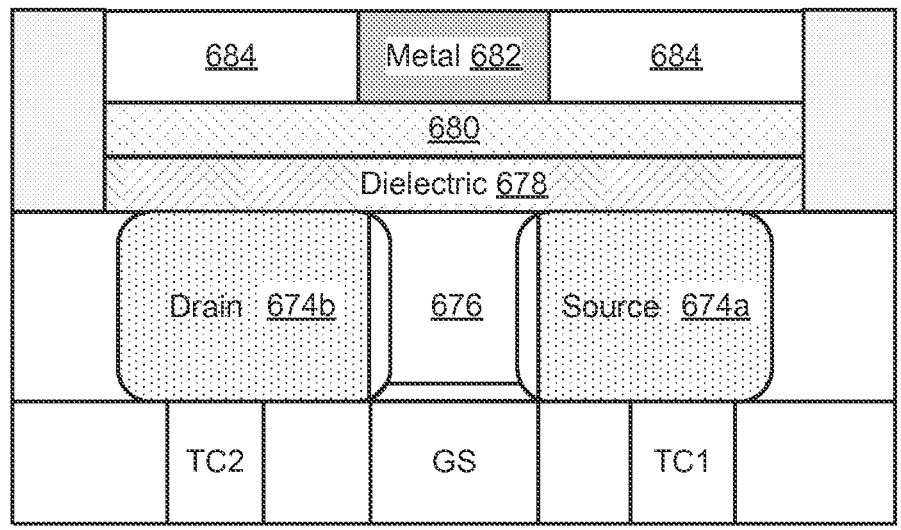

FIG. 6C shows cross-sectional views of IC devices 650, 670 each including insulation structures to aid operation of a circuit component according to a corresponding embodiment. IC devices 650, 670 may include insulation structures such as those of IC device 100, for example. In an embodiment, processing to fabricate such insulation structures includes some or all operations of method 200.

The example embodiment of IC device 650 includes structures variously formed in or on a front side of a substrate—e.g., where such structures include a doped source region 654a, a doped drain region 654b and a fin structure 656 disposed between doped regions 654a, 654b. Activation of a channel in fin structure 656 may be based at least in part on signaling variously received by the circuit component via a gate structure GS and terminal contacts TC1, TC2 coupled to doped regions 654a, 654b, respectively. The substrate may have formed therein a laterally constrained insulation structure—e.g., including dielectric 658—that extends across (e.g., adjoins) at least part of a side of fin structure 656 and, in some embodiments, one or both of regions 654a, 654b. Dielectric 658 may be formed, for example, by processing in or on a back side of the substrate. In the illustrative embodiment shown, a back side metal 662 and gap fill structures 664 are also formed between the back side of the substrate and dielectric 658. Although certain embodiments are not limited in this regard, a variably-doped layer 660 may be deposited, for example, between dielectric 658 and back side metal 662. Layer 660 may include doped borosilicate glass (BSG), phosphosilicate glass (PSG) and/or any of various other doped glasses, arsenide layers, etc. to aid in preventing and/or mitigating the effects of material breakdown at dielectric 658.

The illustrative embodiment of IC device 670 represents an alternative to that of IC device 650—e.g., wherein patterning is to form a relatively more constrained back side metal 882. A circuit component of IC device 670 includes a doped source region 654a, a doped drain region 654b and a fin structure 656 (corresponding functionally to regions 654a, 654b and fin structure 656, respectively) disposed on a front side of a substrate, where a gate structure GS and terminal contacts TC1, TC2 are coupled to variously receive signaling that determines activation of a channel by the circuit component. The substrate includes a dielectric 678 that extends along a side of fin structure 656, where dielectric 678 is prevented from extending laterally in parallel with the front side all the way to an edge (not shown) of the substrate. A back side metal 682 and gap fill structures 684 may be formed in or on the back side of the substrate—e.g., where a variably-doped layer 680 is deposited between dielectric 658 and back side metal 662. In the illustrative embodiment shown, back side metal 662 extends in a region under fin structure 656 and GS, but not (for example) under either of doped regions 654a, 654b.

Figure 7:
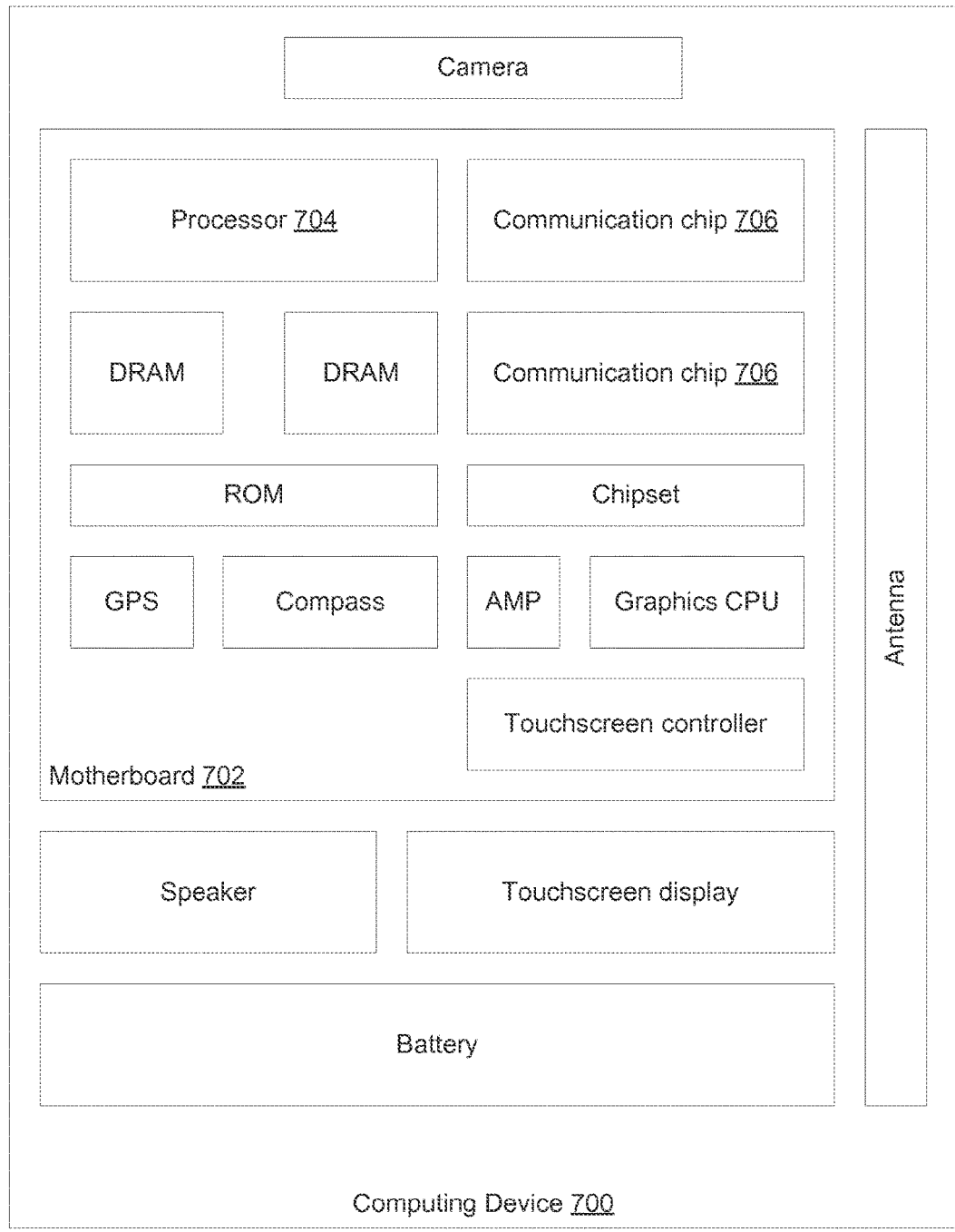
FIG. 7 illustrates a computing device in accordance with one embodiment.

FIG. 7 illustrates a computing device 700 in accordance with one embodiment. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. The term "processor" may refer to any device or portion of a device that processes electronic data from registers and/or memory to transform that electronic data into other electronic data that may be stored in registers and/or memory. The communication chip 706 also includes an integrated circuit die packaged within the communication chip 706.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Embodiments of the present invention may be provided as a computer program product, or software, that may include a machine-readable medium having stored thereon instructions, which may be used to program a computer system (or other electronic devices) to perform a process according to embodiments of the present invention. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 8:
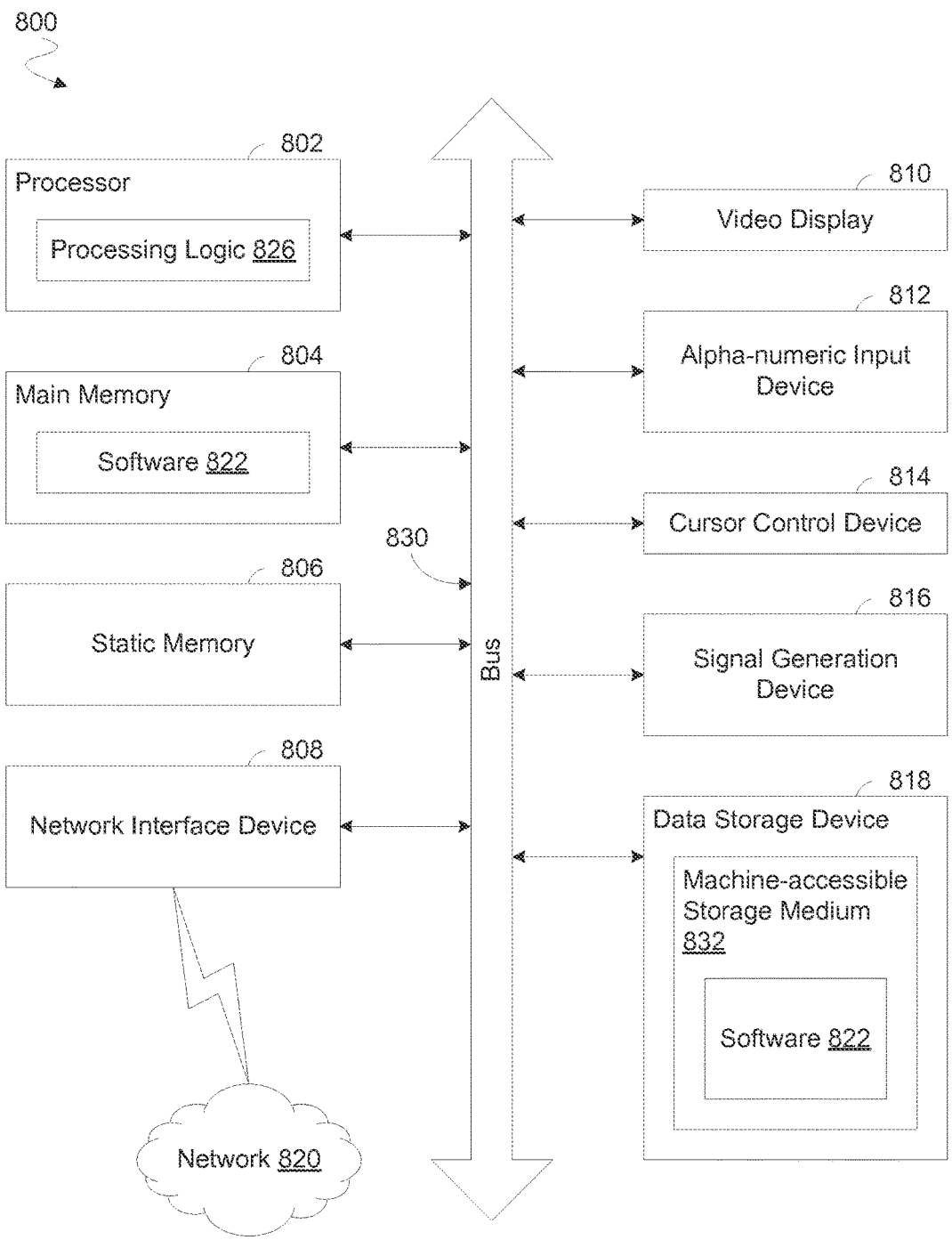
FIG. 8 illustrates a block diagram of an exemplary computer system, in accordance with an embodiment.

FIG. 8 illustrates a diagrammatic representation of a machine in the exemplary form of a computer system 800 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 800 includes a processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

Processor 802 represents one or more general-purpose processing devices such as a microprocessor, central processing unit, or the like. More particularly, the processor 802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 802 may also be one or more special-purpose processing devices such as an application specific integrated circuit (ASIC), a field programmable gate array (FPGA), a digital signal processor (DSP), network processor, or the like. Processor 802 is configured to execute the processing logic 826 for performing the operations described herein.

The computer system 800 may further include a network interface device 808. The computer system 800 also may include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium (or more specifically a computer-readable storage medium) 832 on which is stored one or more sets of instructions (e.g., software 822) embodying any one or more of the methodologies or functions described herein. The software 822 may also reside, completely or at least partially, within the main memory 804 and/or within the processor 802 during execution thereof by the computer system 800, the main memory 804 and the processor 802 also constituting machine-readable storage media. The software 822 may further be transmitted or received over a network 820 via the network interface device 808.

While the machine-accessible storage medium 832 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

Figure 9:
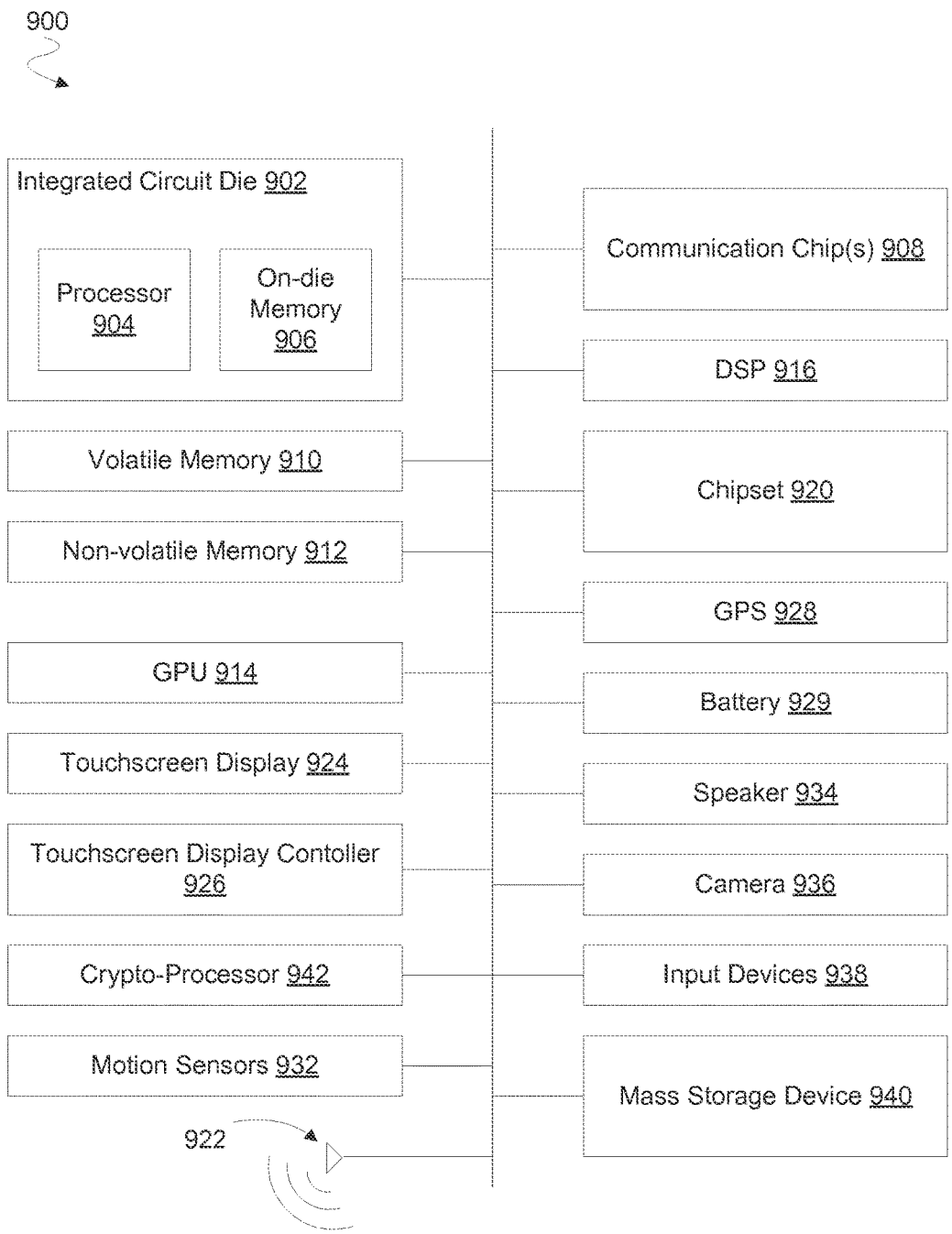
FIG. 9 is a computing device built in accordance with an embodiment.

FIG. 9 illustrates a computing device 900 in accordance with one embodiment. The computing device 900 may include a number of components. In one embodiment, these components are attached to one or more motherboards. In an alternate embodiment, these components are fabricated onto a single system-on-a-chip (SoC) die rather than a motherboard. The components in the computing device 900 include, but are not limited to, an integrated circuit die 902 and at least one communication chip 908. In some implementations the communication chip 908 is fabricated as part of the integrated circuit die 902. The integrated circuit die 902 may include a CPU 904 as well as on-die memory 906, often used as cache memory, that can be provided by technologies such as embedded DRAM (eDRAM) or spin-transfer torque memory (STTM or STTM-RAM).

Computing device 900 may include other components that may or may not be physically and electrically coupled to the motherboard or fabricated within an SoC die. These other components include, but are not limited to, volatile memory 910 (e.g., DRAM), non-volatile memory 912 (e.g., ROM or flash memory), a graphics processing unit 914 (GPU), a digital signal processor 916, a crypto processor 942 (a specialized processor that executes cryptographic algorithms within hardware), a chipset 920, an antenna 922, a display or a touchscreen display 924, a touchscreen controller 926, a battery 929 or other power source, a power amplifier (not shown), a global positioning system (GPS) device 928, a compass 930, a motion coprocessor or sensors 932 (that may include an accelerometer, a gyroscope, and a compass), a speaker 934, a camera 936, user input devices 938 (such as a keyboard, mouse, stylus, and touchpad), and a mass storage device 940 (such as hard disk drive, compact disk (CD), digital versatile disk (DVD), and so forth).

The communications chip 908 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 908 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 908. For instance, a first communication chip 908 may be dedicated to shorter range wireless communications such as Wi-Fi and Bluetooth and a second communication chip 908 may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory. In various embodiments, the computing device 900 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

In one implementation, an integrated circuit (IC) comprises a first circuit component including a first doped region disposed in or on a first side of a substrate, a second doped region disposed in or on the first side of the substrate, a third region disposed in or on the first side of the substrate, the third region between the first doped region and the second doped region, and a gate structure coupled to the substrate via the first side, the gate structure to control an exchange of current in the third region. The IC further comprises an insulation structure disposed in the substrate proximate to the third region, wherein, in a direction parallel to the first side, a maximum extent of the insulation structure is closer than an edge of the substrate to the first circuit component.

In an embodiment, the first circuit component is a gated diode. In another embodiment, the first circuit component is a transistor. In another embodiment, the insulation structure adjoins the third region. In another embodiment, the insulation structure adjoins the first doped region or the second doped region. In another embodiment, of a plurality of circuit components of the IC, the first circuit component is the only circuit component adjacent to the insulation structure. In another embodiment, the third region includes a p– doped sub-region and an n-doped sub-region. In another embodiment, the first circuit component further comprises another gate structure coupled to the substrate via the first side. In another embodiment, the insulation structure is surrounded between the first side and the second side by semiconductor material of the substrate. In another embodiment, a plurality of circuit components of the IC device includes the first IC component, and a plurality of insulation structures of the IC device includes the insulation structure, wherein, of the plurality of circuit components, the plurality of insulation structures each extend under only a respective one of the plurality of circuit components.

In another implementation, a method comprises forming a first circuit component, including forming in or on a first side of a substrate a first doped region, a second doped region and a third region between the first doped region and the second doped region, and disposing a gate structure on the substrate, wherein the gate structure is coupled to the substrate via the first side. The method further comprises performing thinning to expose a second side of the substrate, the second side opposite the first side, after the thinning, forming a recess in the second side of the substrate, and forming an insulation structure in the recess, wherein, in a direction parallel to the first side, a maximum extent of the insulation structure is closer than an edge of the substrate to the first circuit component.

In an embodiment, forming the first circuit component includes forming a gated diode. In another embodiment, forming the first circuit component includes forming a transistor. In another embodiment, the insulation structure adjoins the third region. In another embodiment, the insulation structure adjoins the first doped region or the second doped region. In another embodiment, forming the first circuit component includes forming a plurality of circuit components, and wherein the first circuit component is the only circuit component adjacent to the insulation structure. In another embodiment, the third region includes a p– doped sub-region and an n-doped sub-region. In another embodiment, forming the first circuit component further comprises forming another gate structure coupled to the substrate via the first side. In another embodiment, the insulation structure is surrounded between the first side and the second side by semiconductor material of the substrate. In another embodiment, forming the first circuit component includes forming a plurality of circuit components of an integrated circuit (IC) device, and wherein forming the insulation structure includes forming a plurality of insulation structures of the IC device, wherein, of the plurality of circuit components, the plurality of insulation structures each extend under only a respective one of the plurality of circuit components.

In another implementation, a system comprises an integrated circuit (IC) including a first IC component comprising a first doped region disposed in or on a first side of a substrate, a second doped region disposed in or on the first side of the substrate, a third region disposed in or on the first side of the substrate, the third region between the first doped region and the second doped region, and a gate structure coupled to the substrate via the first side, the gate structure to control an exchange of current in the third region. The IC further comprises an insulation structure disposed in the substrate proximate to the third region, wherein, in a direction parallel to the first side, a maximum extent of the insulation structure is closer than an edge of the substrate to the first circuit component. The system further comprise a display device coupled to the integrated circuit, the display device to display an image based on signals exchanged with the first IC component.

In an embodiment, the first circuit component is a gated diode. In another embodiment, the first circuit component is a transistor. In another embodiment, the insulation structure adjoins the third region. In another embodiment, the insulation structure adjoins the first doped region or the second doped region. In another embodiment, of a plurality of circuit components of the IC, the first circuit component is the only circuit component adjacent to the insulation structure. In another embodiment, the third region includes a p– doped sub-region and an n-doped sub-region. In another embodiment, the first circuit component further comprises another gate structure coupled to the substrate via the first side. In another embodiment, the insulation structure is surrounded between the first side and the second side by semiconductor material of the substrate. In another embodiment, a plurality of circuit components of the IC device includes the first IC component, and a plurality of insulation structures of the IC device includes the insulation structure, wherein, of the plurality of circuit components, the plurality of insulation structures each extend under only a respective one of the plurality of circuit components.

Techniques and architectures for providing electrical isolation of integrated circuitry are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An integrated circuit (IC) comprising:
    a first circuit component including:
        a first doped region disposed in or on a first side of a substrate;
        a second doped region disposed in or on the first side of the substrate;
        a third region disposed in or on the first side of the substrate, the third region between the first doped region and the second doped region; and
        a gate structure coupled to the substrate via the first side, the gate structure to control an exchange of current in the third region; and
    an insulation structure disposed in the substrate proximate to the third region, wherein, in a direction parallel to the first side, a maximum extent of the insulation structure is closer than an edge of the substrate to the first circuit component, the insulation structure having a first sidewall and a second sidewall opposite the first sidewall, the first sidewall and the second sidewall in contact with a semiconductor material of the substrate.

2. The integrated circuit of claim 1, wherein the first circuit component is a gated diode.

3. The integrated circuit of claim 1, wherein the first circuit component is a transistor.

4. The integrated circuit of claim 1, wherein the insulation structure adjoins the third region.

5. The integrated circuit of claim 1, wherein the insulation structure adjoins the first doped region or the second doped region.

6. The integrated circuit of claim 1, wherein, of a plurality of circuit components of the IC, the first circuit component is the only circuit component adjacent to the insulation structure.

7. The integrated circuit of claim 1, wherein the third region includes a p− doped sub-region and an n-doped sub-region.

8. The integrated circuit of claim 1, the first circuit component further comprising another gate structure coupled to the substrate via the first side.

9. The integrated circuit of claim 1, wherein the insulation structure is surrounded between the first side and the second side by semiconductor material of the substrate.

10. The integrated circuit of claim 1, wherein a plurality of circuit components of the IC device includes the first IC component, and a plurality of insulation structures of the IC device includes the insulation structure, wherein, of the plurality of circuit components, the plurality of insulation structures each extend under only a respective one of the plurality of circuit components.

11. A method comprising:
    forming a first circuit component, including:
        forming in or on a first side of a substrate a first doped region, a second doped region and a third region between the first doped region and the second doped region; and disposing a gate structure on the substrate, wherein the gate structure is coupled to the substrate via the first side;
    performing thinning to expose a second side of the substrate, the second side opposite the first side;
    after the thinning, forming a recess in the second side of the substrate; and
    forming an insulation structure in the recess, wherein, in a direction parallel to the first side, a maximum extent of the insulation structure is closer than an edge of the substrate to the first circuit component, wherein the insulation structure is confined to the recess.

12. The method of claim 11, wherein forming the first circuit component includes forming a gated diode.

13. The method of claim 11, wherein forming the first circuit component includes forming a transistor.

14. The method of claim 11, wherein the insulation structure adjoins the third region.

15. The method of claim 11, wherein forming the first circuit component includes forming a plurality of circuit components, and wherein the first circuit component is the only circuit component adjacent to the insulation structure.

16. The method of claim 11, wherein forming the first circuit component includes forming a plurality of circuit components of an integrated circuit (IC) device, and wherein forming the insulation structure includes forming a plurality of insulation structures of the IC device, wherein, of the plurality of circuit components, the plurality of insulation structures each extend under only a respective one of the plurality of circuit components.

17. A system comprising:
an integrated circuit (IC) including:
a first IC component comprising: a first doped region disposed in or on a first side of a substrate; a second doped region disposed in or on the first side of the substrate; a third region disposed in or on the first side of the substrate, the third region between the first doped region and the second doped region; and a gate structure coupled to the substrate via the first side, the gate structure to control an exchange of current in the third region; and
an insulation structure disposed in the substrate proximate to the third region, wherein, in a direction parallel to the first side, a maximum extent of the insulation structure is closer than an edge of the substrate to the first circuit component, the insulation structure having a first sidewall and a second sidewall opposite the first sidewall, the first sidewall and the second sidewall in contact with a semiconductor material of the substrate; and
a display device coupled to the integrated circuit, the display device to display an image based on signals exchanged with the first IC component.

18. The system of claim 17, wherein the first circuit component is a gated diode.

19. The system of claim 17, wherein the first circuit component is a transistor.

20. The system of claim 17, wherein, of a plurality of circuit components of the IC, the first circuit component is the only circuit component adjacent to the insulation structure.

21. The system of claim 17, wherein a plurality of circuit components of the IC device includes the first IC component, and a plurality of insulation structures of the IC device includes the insulation structure, wherein, of the plurality of circuit components, the plurality of insulation structures each extend under only a respective one of the plurality of circuit components.

* * * * *